United States Patent [19]
Arell

[11] Patent Number: 6,016,076
[45] Date of Patent: Jan. 18, 2000

[54] METHOD AND APPARATUS FOR MICROWAVE PREDISTORTER LINEARIZER WITH ELECTRONIC TUNING

[75] Inventor: Thomas William Arell, Harvard, Mass.

[73] Assignee: The Whitaker Corporation, Wilmington, Del.

[21] Appl. No.: 09/092,323

[22] Filed: Jun. 5, 1998

[51] Int. Cl.[7] .................................................. H03F 1/26
[52] U.S. Cl. .......................................... 330/149; 330/305
[58] Field of Search ................................... 330/149, 305; 333/28 R; 375/296

[56] References Cited

U.S. PATENT DOCUMENTS

| | | | |
|---|---|---|---|
| 2,342,544 | 2/1944 | Jacobs | 178/44 |
| 3,577,089 | 5/1971 | Gorog | 328/165 |
| 4,647,872 | 3/1987 | Johnson . | |
| 4,683,443 | 7/1987 | Young et al. . | |
| 5,022,083 | 6/1991 | Rimkeit et al. | 381/98 |
| 5,101,173 | 3/1992 | DiPiazza et al. . | |
| 5,144,266 | 9/1992 | Dougherty et al. . | |
| 5,331,291 | 7/1994 | D'Agostino et al. . | |
| 5,432,482 | 7/1995 | Bailey . | |
| 5,594,385 | 1/1997 | Anvari | 330/149 |
| 5,710,519 | 1/1998 | McCalpin et al. . | |

OTHER PUBLICATIONS

Analysis and Design of Analog Integrated Circuits, Second Edition, by Paul R. Gray and Robert G. Meyer, pp. 326, 366, 755–756.

Primary Examiner—Robert Pascal
Assistant Examiner—Henry Choe

[57] ABSTRACT

A predistorter linearizer includes a magnitude distorter and a phase distorter, each including variability to provide a desired magnitude characteristic and phase characteristic. The method comprises adjusting a circuit to provide a desired magnitude characteristic and adjusting the circuit to provide a desired phase characteristic. A signal is modified using the desired magnitude and phase characteristics to produce a signal for amplification. The modification of the signal is offset by any modification resulting from the amplification, resulting in a more linearized amplifier output.

10 Claims, 4 Drawing Sheets

METHOD AND APPARATUS FOR MICROWAVE PREDISTORTER LINEARIZER WITH ELECTRONIC TUNING

BACKGROUND OF THE INVENTION

1. Field of the Invention

This invention relates generally to a predistortion linearizer circuit useful for altering a signal prior to its input to a power amplifier in order to better linearize the output of the amplifier, and, more particularly, to a predistortion linearizer circuit with electronic tuning to linearize the power amplifier output.

2. Description of the Related Art

High power amplifiers are routinely employed in many applications to amplify a signal to a power level sufficient for its intended transmission. For example, high power amplifiers are commonly employed in base station applications to amplify a signal for transmission. Solid state power amplifiers and traveling wave tube amplifiers are just two examples of high power amplifiers that have been used in these applications.

Although these high power amplifiers impart sufficient gain to the amplified signal such that the signal may be transmitted along its intended path, the gain through the amplifier is typically not constant, but rather varies as a function of the input signal level. As a general rule, as the input signal power increases, the amplifier will introduce a gain expansion followed by gain compression. In addition, the input signal experiences a phase shift through the high power amplifier, and the amount of phase shift is also a function of the input signal level. Generally, the phase will initially lead then lag with increasing input power. These amplitude and phase nonlinearities introduced by the high power amplifier distort the transmitted signal and, accordingly, the information carried by the signal.

Predistortion linearizer circuits have been employed to offset the distortion introduced by the power amplifier. A predistortion linearizer circuit introduces a distortion to the signal to be transmitted prior to amplification of the signal in the amplifier. The distortion introduced by the predistortion linearizer circuit ideally is the inverse of the distortion the amplifier will introduce, at least over some specified range of input signal power and range of operation of the amplifier. That is, a gain and phase nonlinearity introduced by the predistortion linearizer circuit will cancel the gain and phase nonlinearity introduced by the amplifier over the specified range, and the output of the amplifier will be relatively linear over that range.

Various predistortion circuits have been described in the prior art. However, those circuits each suffer from one or more undesirable characteristics. For example, certain predistortion linearizer circuits are too large because of their complexity. Other predistortion linearizers, while not as large, do not provide a sufficiently complex transfer characteristic to yield the linearized output at the high power amplifier that is desired. In general, predistortion linearizers have not been flexible in their gain and phase response, being incapable of adjusting to changing conditions of operation to maintain optimum performance characteristics.

The present invention is directed to overcoming, or at least reducing the effect of, one or more of the problems set forth above.

SUMMARY OF THE INVENTION

In one aspect of the invention, a predistorter linearizer for use with a radio frequency amplifier comprises a gain distorter having a first variable load to provide variability in the gain characteristic of the gain distorter. The predistorter linearizer also includes a phase distorter having a second variable load to provide variability in a phase characteristic of the phase distorter. The gain distorter and phase distorter cooperate to modify a signal prior to its input to the radio frequency amplifier.

In another aspect of the present invention, an apparatus includes a first circuit having an input terminal and an output terminal. The first circuit includes three branches connected in electrical parallel between the input and output terminals. The first branch has a nonlinear element, such as a diode or field-effect transistor (FET), and a variable load in series, and the second branch has a nonlinear element and a variable load. The third branch has a variable load. A second circuit is connected to the first circuit and also includes three branches connected in electrical parallel. In the second circuit, the first branch includes a nonlinear element and a variable load, and the second branch also has a nonlinear element and a variable load. The third branch in the second circuit comprises a variable load. The first and second circuits are coupled in electrical series.

In yet another aspect of the invention, a method is provided for modifying a signal for later amplification, the method comprising adjusting a circuit to provide a desired magnitude characteristic and adjusting the circuit to provide a desired phase characteristic. The signal to be modified is received and modified using the desired magnitude and phase characteristics to produce a distorted signal. The distorted signal is provided to an amplifier for amplification, wherein the modification of the signal is offset by a further modification in the amplifier, resulting in a linearized amplifier output. The magnitude and phase characteristics may be adjusted prior to or while receiving and processing the signal to be modified.

BRIEF DESCRIPTION OF THE DRAWINGS

The invention may be understood by reference to the following description taken in conjunction with the accompanying drawings, in which like reference numerals identify like elements, and in which.

Figure 1:
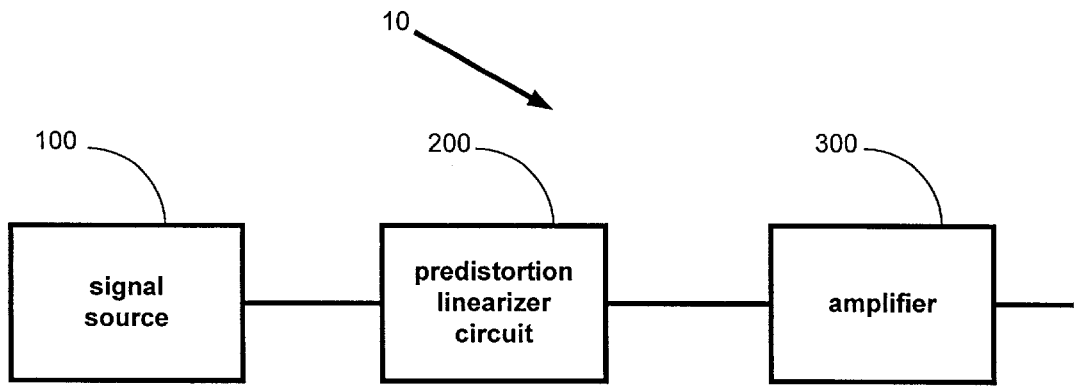
FIG. 1 is a block diagram illustrating a portion of a high power amplifier system in which a predistortion linearizer circuit has been inserted in the signal path between the signal source and the high power amplifier.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 shows a block diagram of a portion of an amplifier system 10 in which a predistortion linearizer circuit 200 has been inserted in a signal path between a signal source 100 and an amplifier 300. In processing a signal, the amplifier 300 will typically introduce magnitude and phase distortions to the input signal which are not constant, but rather, are each functions of the input signal level. For example, in amplifiers with multiple transistor stages biased in class A and AB operation, with increasing input signal power, there is initially gain expansion followed by gain compression, while the phase initially leads then lags.

The predistortion linearizer circuit 200 is designed to offset the gain and phase nonlinearities of the amplifier 300 by introducing magnitude and phase distortions to the input signal that, over a specified range of operation, will cancel the effects of the distortion introduced by the amplifier 300. That is, the predistortion linearizer circuit 200 should exhibit decreasing magnitude followed by increasing magnitude, and the phase must initially lag and then lead, with increasing input power The output signal from the amplifier 300 will then be more linear.

Figure 2:
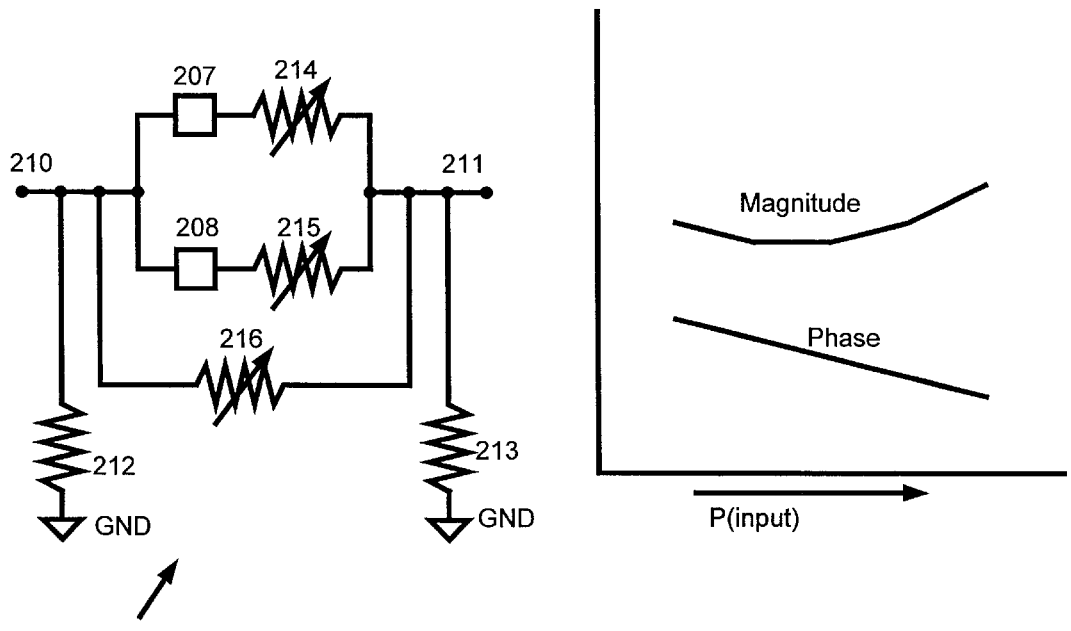
FIG. 2 shows one generalized embodiment of a first stage of a two-stage predistortion linearizer circuit according to the present invention, as well as magnitude and phase responses of the first stage.

FIG. 2 illustrates one generalized embodiment of a first stage 201 of a two-stage predistortion linearizer circuit according to the present invention. Also shown in FIG. 2 are the general magnitude and phase responses of the first-stage circuit 201. The first-stage circuit 201 shown in FIG. 2 includes dynamic control of resistance elements to allow for electronic adjustment of the magnitude and phase characteristics of the circuit 201. As shown by the generalized graph of FIG. 2, the first-stage circuit 201 introduces a decreasing magnitude followed by increasing magnitude with increasing input signal power. At the same time, the circuit 201 introduces a phase lag with increasing signal power.

The first-stage circuit 201 of FIG. 2 receives an input signal from a signal source at a node 210, and produces an output signal at a node 211. The node 210 is coupled to electrical ground through a load 212, while the node 211 is coupled to electrical ground through a load 213. The circuit 201 includes nonlinear elements 207 and 208, for example, diodes or FETs. A variable load 214 is coupled in series with the nonlinear element 207, while a variable load 215 is coupled in series with the nonlinear element 208, the nonlinear elements 207 and 208 and loads 214 and 215 forming parallel paths between the node 210 and the node 211. In addition, the circuit 201 includes a variable load 216 coupled between the node 210 and the node 211. The variable loads 214 and 215 may be replaced by a single variable load coupled in electrical series with the parallel combination of the two nonlinear elements 207 and 208.

As already pointed out, in general, the first-stage circuit 201 contributes a decreasing magnitude followed by an increasing magnitude with increasing input signal power. A phase lag component will also be introduced. Adjustment of the variable loads will affect the level and slope of the magnitude response, as well as affect the negative slope of the phase response. In general, variation of the load 216 will determine the overall amount of variation upward or downward shift in the magnitude and phase responses, while variation in the loads 214 and 215 will result in a greater or lesser slope in the magnitude response and will increase or decrease the slope of the phase response.

Figure 3:
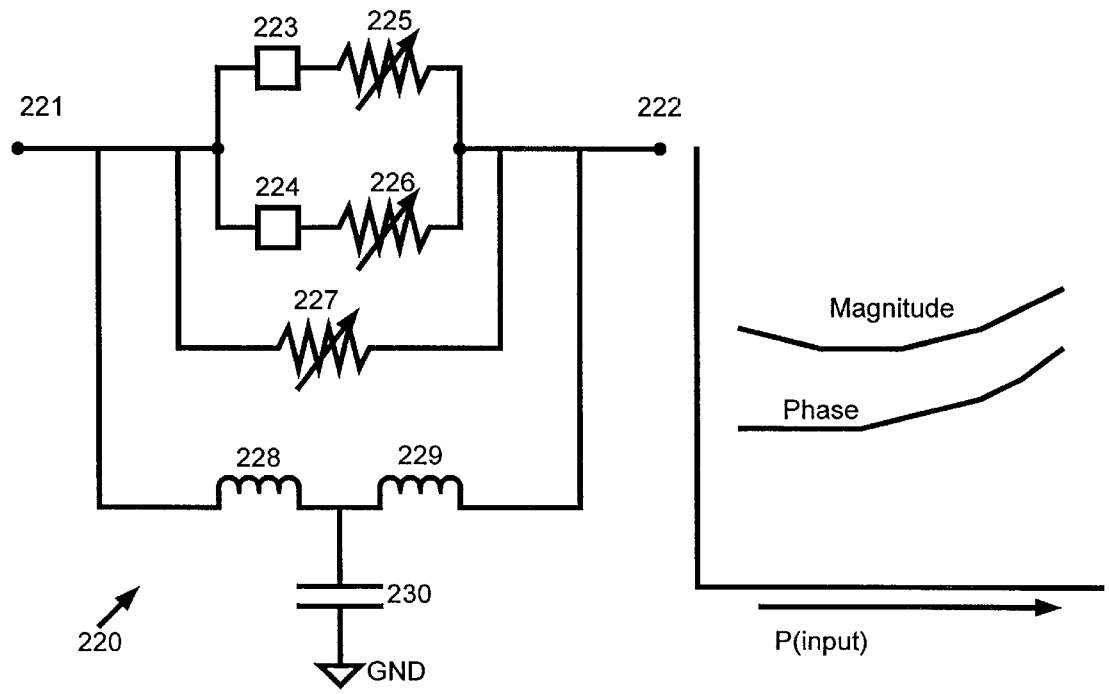
FIG. 3 shows one generalized embodiment of a second stage of a two-stage predistortion linearizer circuit according to the present invention, as well as magnitude and phase responses of the second stage.

FIG. 3 shows one generalized embodiment of a second-stage 220 of a two-stage predistortion linearizer circuit according to the present invention. Also shown in FIG. 3 are the general magnitude and phase responses of the second-stage circuit 220. The second-stage circuit 220 includes a low pass filter and dynamic control of resistance elements to allow for electronic adjustment of the phase and magnitude characteristics of the circuit 220. As shown by the generalized graph of FIG. 3, the second-stage circuit 220 introduces a decreasing magnitude followed by an increasing magnitude with increasing input signal power. At the same time, the circuit 220 first introduces a constant phase component followed by an increasing phase lead with increasing signal power.

The second-stage circuit 220 of FIG. 3 receives a signal at a node 221 and produces an output signal at a node 222. The circuit 220 includes nonlinear elements, for example, diodes or FETs, 223 and 224. A variable load 225 is coupled in series with the nonlinear element 223, while a variable load 226 is coupled in series with the nonlinear element 224. The nonlinear elements 223 and 224 and loads 225 and 226 form parallel paths between the nodes 221 and 222. The circuit 220 also includes a variable load 227 coupled between the nodes 221 and 222. A low pass filter, comprising inductors 228 and 229 and a capacitor 230, is also coupled between the nodes 221 and 222. The variable loads 225 and 226 may be replaced by a single variable load coupled in electrical series with the parallel combination of the two nonlinear elements 223 and 224.

As in the case of the first-stage circuit 201 shown in FIG. 2, the second-stage circuit 220 of FIG. 3 contributes a decreasing magnitude followed by an increasing magnitude with increasing input signal power. Adjusting the variable loads 225, 226 and 227 primarily affects the level and slope of the magnitude response in a manner similar to the variable loads 214, 215 and 216 of the circuit 201 of FIG. 2. The inductors 228 and 229 and the capacitor 230 in the circuit 220 of FIG. 3 will introduce a phase lead component, with increasing lead as the input signal power increases.

Figure 4:
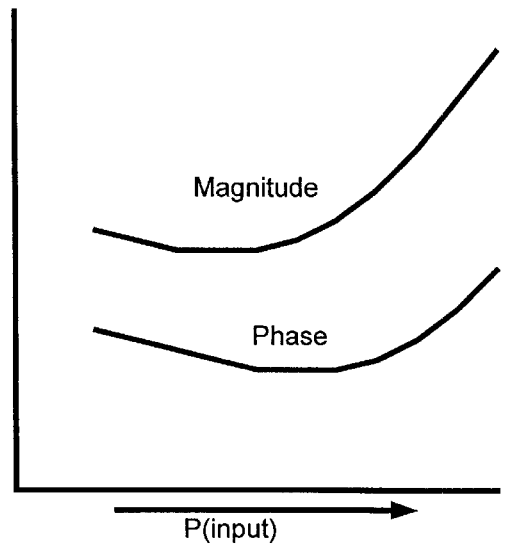
FIG. 4 shows the general magnitude and phase responses of a combination of the first and second-stage circuits of FIGS. 2 and 3.

FIG. 4 shows the general magnitude and phase responses of a combination of the first and second-stage circuits 201 and 220 of FIGS. 2 and 3. With increasing input signal power, the magnitude through the first and second-stages 201 and 220 initially decreases and then increases. The composite phase response illustrates that initially a phase lag is introduced and then a phase lead occurs as the input signal power increases. As mentioned earlier, this general magnitude and phase response is the inverse of, and serves to offset, the gain and phase response typically seen in the subsequent amplifier stage.

Figure 5:
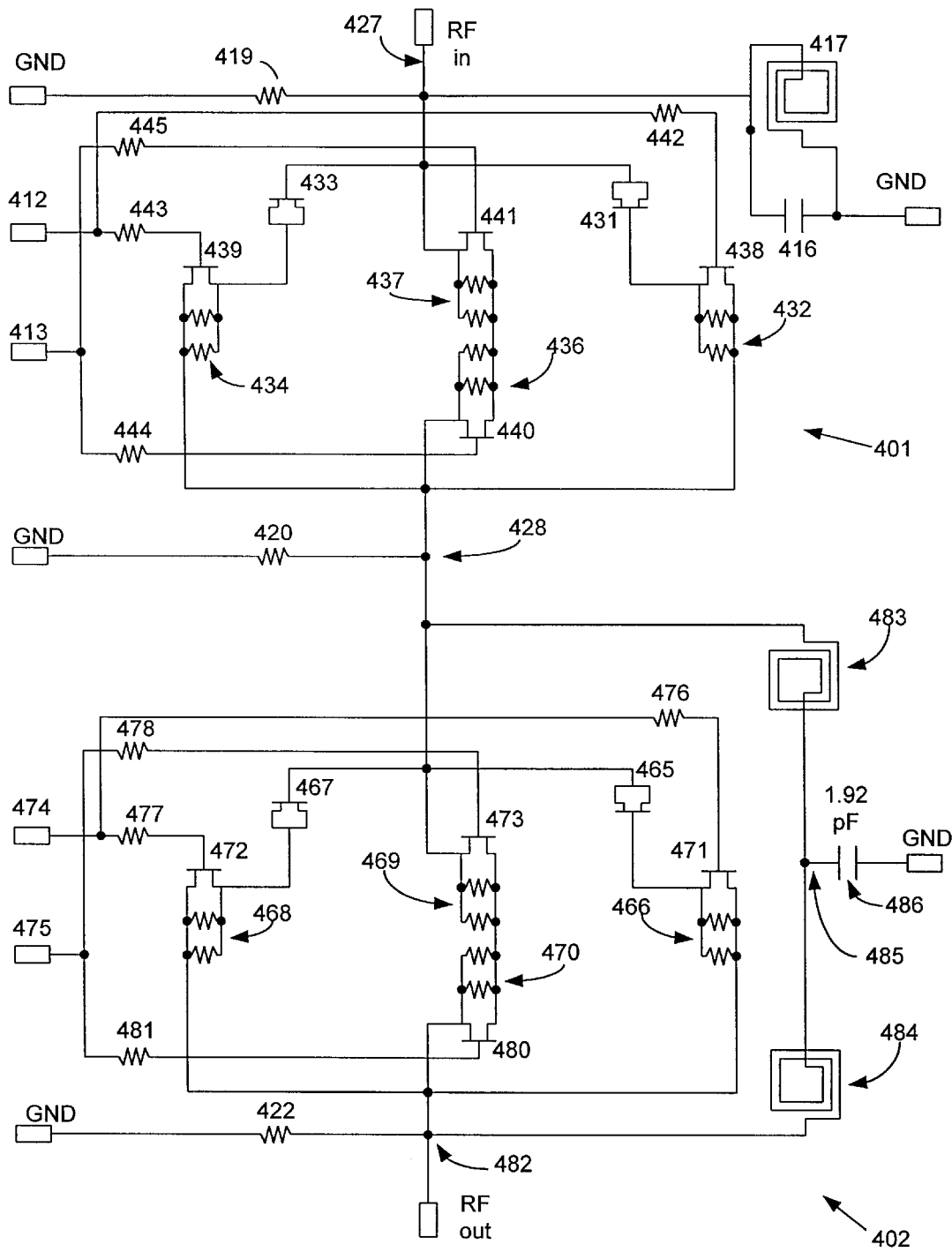
FIG. 5 is one embodiment of a predistortion linearizer circuit according to the present invention in which circuits similar to those of FIGS. 2 and 3 have been cascaded to form a two-stage linearizer circuit.

FIG. 5 is a schematic diagram of a predistortion linearizer circuit 400 according to the present invention. The circuit 400 includes two stages 401 and 402 cascaded. The two stages 401 and 402 of the linearizer circuit 400 are similar, with the exception that the second stage 402 includes a low pass filter. The first stage 401 of the cascade circuit 400 yields a decreasing magnitude followed by an increasing magnitude as well as a phase lag response, whereas the second stage 402 of the cascade yields a decreasing magnitude followed by an increasing magnitude as well as a phase lead response.

The first stage 401 includes three branches in parallel between an input node 427 and a node 428. The first branch between the nodes 427 and 428 includes a diode 431 and a resistive load 432 connected in series. The second branch between the nodes 427 and 428 includes a diode 433 and a resistive load 434 connected in series. The third branch between the nodes 427 and 428 includes two resistive loads 436 and 437. In one embodiment, each of the resistive loads 432, 434, 436 and 437 comprises two 600-ohm resistors connected in parallel. In that embodiment, the diodes 431 and 433 have been implemented as gallium-arsenide field-effect transistors (FETs) having drain and source terminals connected.

Each of the resistive loads 432, 434, 436 and 437 has an FET device 438, 439, 440 and 441 connected across it as shown in FIG. 5. Each of the FETs 438, 439, 440 and 441 has a drain terminal connected to one side of its corresponding resistive load 432, 434, 436 and 437 and a source terminal connected to the other side of its corresponding resistive load 432, 434, 436 and 437. The FET 438 is connected across the resistive load 432, the FET 439 is connected across the resistive load 434, the FET 440 is connected across the resistive load 436, and the FET 441 is connected across the resistive load 437. Each of the FETs 438, 439, 440 and 441 is biased at its gate by a voltage source 412, 413 through resistive loads 442, 443, 444 and 445, respectively. The voltage source 412 biases the gate terminals of the FETs 438 and 439 through the resistive loads 442 and 443, respectively. The voltage source 413 biases the gate terminals of the FETs 440 and 441 through the resistive loads 444 and 445, respectively. The values of the voltage sources 412 and 413, as well as the values of the resistive loads 442, 443, 444 and 445, will control the conductivity of the FETs 438, 439, 440 and 441. The effective loads in the three parallel branches can thus be varied to achieve the desired magnitude and phase effects to be introduced by the first stage 401 of the predistortion linearizer circuit 400. In an alternative embodiment, the two resistive loads 432 and 434 may be a single resistive load coupled in electrical series with the parallel combination of the diodes 431 and 433. A single FET, in lieu of the two FETs 438 and 439 could then be connected across the single resistive load to vary and control the effective value of the load. In addition, a single nonlinear element may suffice in place of the two diodes 431 and 433, reducing the number of elements and branches in the first stage 401.

A resistive load 419 is coupled between the node 427 and electrical ground. A resistive load 420 is coupled between the node 428 and electrical ground. An inductor 417 and a capacitor 416, coupled in parallel, are connected between the node 427 and electrical ground.

The second stage 402 of the predistortion linearizer circuit 400 includes three branches coupled in parallel between the node 428 and an output node 482. Those three parallel branches are similar to the three parallel branches described earlier that are included in the first stage 401. In addition, the second stage 402 includes a low pass filter connected between node 428 and the node 482. The low pass filter includes inductors 483 and 484 connected in series between the nodes 428 and 482, as well as a shunting capacitor 486 coupled between an electrical ground and a commnon node 485 between the inductors 483 and 484. The three parallel branches of the second stage 402 are each coupled at one end to the node 428 and at their second end to the output node 482. A resistive load 422 is connected between the output node 482 and an electrical ground. The low pass filter, comprising inductors 483 and 484 and a capacitor 486, assists in obtaining the desired phase lead response from the second stage 402.

The three parallel branches of the second stage 402 coupled between the nodes 428 and 482 are configured substantially identically to the three parallel branches in the first stage 401 between the nodes 427 and 428. A first branch in the second stage 402 comprises a diode 465 and a resistive load 466. Coupled across the resistive load 466 is an FET 471 whose gate terminal is biased by a voltage source 474 through a resistive load 476. A second branch in the second stage 402 comprises a diode 467 and a resistive load 468. Connected across the resistive load 468 is an FET 472 whose gate terminal is biased by the voltage source 474 through a resistive load 477. The third branch in the second stage 402 includes two resistive loads 469 and 470. Connected across the load 469 is an FET 473 whose gate terminal is biased by a voltage source 475 through a resistive load 478. An FET 480 is connected across the resistive load 470, and the gate terminal of the FET 470 is biased by the voltage source 475 through a resistive load 481. As in the first stage 401, the diodes 465 and 467 are implemented by gallium-arsenide FET devices having drain and source terminals connected together, and the resistive loads 466, 468, 469 and 470 each comprise a pair of 600-ohm resistors in parallel. The effective loads in the three parallel branches of the second stage 402 may be controlled by the voltage sources 474 and 475 and the resistive loads 476, 477, 478 and 481 to obtain the desired magnitude and phase effects. In an alternative embodiment, the two resistive loads 466 and 468 may be a single resistive load coupled in electrical series with the parallel combination of the diodes 465 and 467. A single fET, in lieu of the two FETs 471 and 472, could then be connected across the single resistive load to vary and control the effective value of the load. In addition, a single nonlinear element may suffice in place of the two diodes 465 and 467, reducing the number of elements and branches in the second stage 402.

Figure 6:
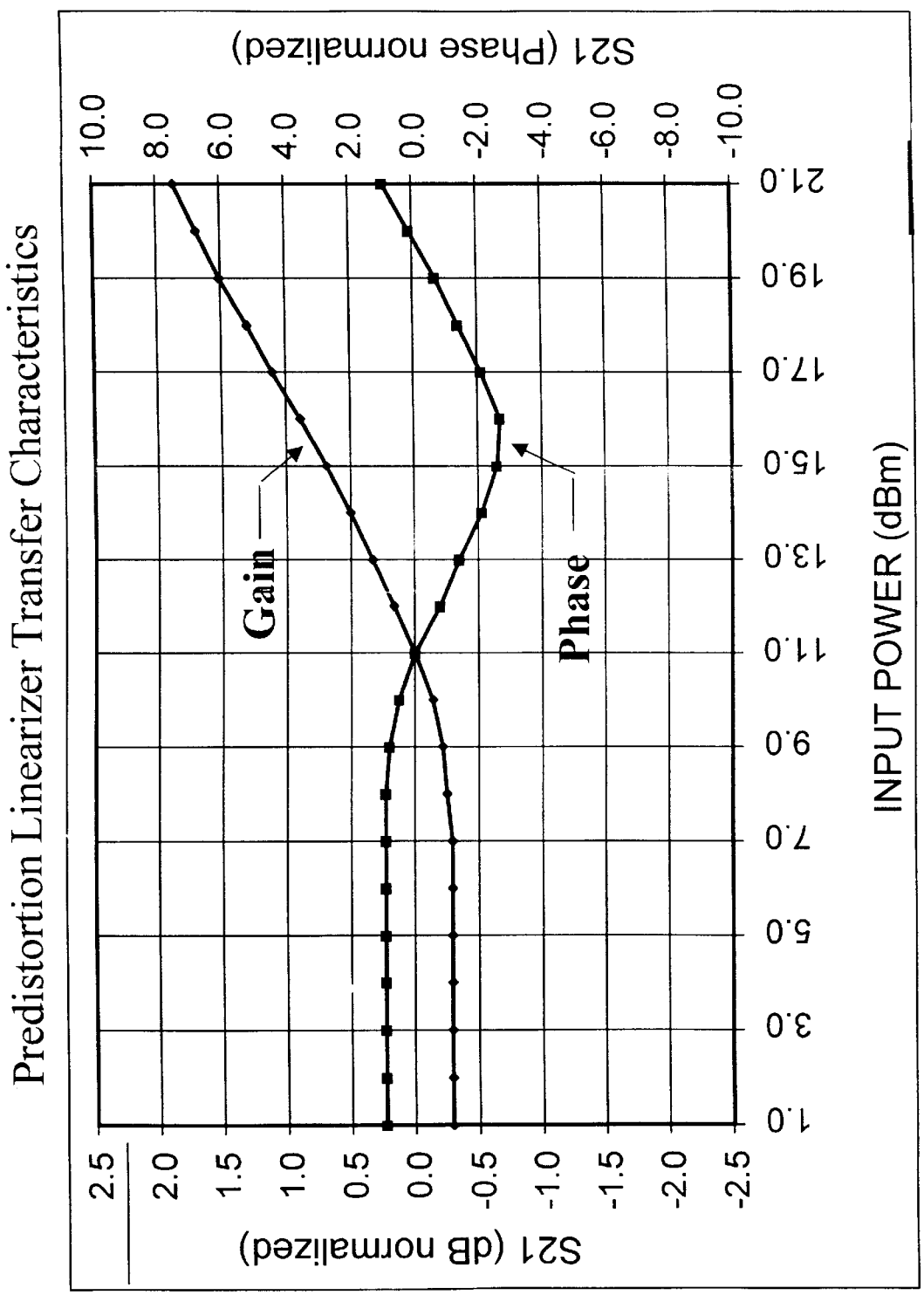
FIG. 6 shows the magnitude and phase response of the predistortion linearizer circuit of FIG. 5.

FIG. 6 shows a transfer characteristic for the circuit 400 of FIG. 5. As is illustrated, the magnitude and phase responses of the circuit 400 in FIG. 5 are functions of the power level of the input signal at the terminal 427. The distortion to the input signal at the terminal 427 that is introduced by the circuit 400 of FIG. 5 will be observed at the output terminal 482 of the circuit 400. That magnitude and phase distortion will offset the gain and phase distortion introduced to the signal by the amplifier that receives the signal from the terminal 482 of the circuit 400. As a result, the output of the amplifier will be more linear, that is, less dependent on the power level of the signal from the signal source.

The present invention provides flexibility in customizing the magnitude and phase response of the predistortion linearizer circuit. Using the embodiment shown in FIG. 5 as an example, the voltage sources 412, 413, 474 and 475 may be controlled by a microcontroller (not shown) such that the transfer characteristics of the circuit may be adjusted "on the fly." That is, given variation in the temperature, frequency of operation, or other parameter of the amplifier, the gain and phase response of the amplifier may vary, and dynamic adjustability of the magnitude and phase response of the predistortion linearizer circuit will enable the linearizer/amplifier combination to operate more optimally. Also, because the voltage sources 412, 413, 474 and 475 may be set at any desired value to achieve optimum performance from the amplifier, a single implementation of the linearizer circuit can be optimized for a variety of amplifiers having different gain and phase characteristics. That is, using a single implementation, the linearizer circuit may be optimized for a first amplifier using a first set of voltage values at sources 412, 413, 474 and 475, while a second, identical linearizer circuit may be optimized for a second, different amplifier using a second set of voltage values. Hence, a single implementation simplifies manufacture while retaining the needed flexibility. The linearizer circuit has been implemented as an integrated circuit using conventional IC fabrication techniques. The invention is particularly well-suited for IC manufacture because it uses conventional integrated circuit elements.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
    a first circuit having a first input terminal and a first output terminal, the first circuit including first, second and third branches coupled in electrical parallel between the first input and output terminals, the first branch having a first diode and a first variable load coupled in electrical series, the second branch having a second diode and a second variable load coupled in electrical series, and the third branch having a third variable load coupled in electrical series; and
    a second circuit having a second input terminal, a second output terminal and a low pass filter coupled between the second input terminal and the second output terminal, the second circuit including fourth, fifth and sixth branches colipled in electrical parallel between the second input and output terminals, the fourth branch having a third diode and a fourth variable load coupled in electrical series, the fifth branch having a fourth diode and fifth variable load coupled in electrical series, and the sixth branch having a sixth variable load coupled in electrical series, the first output terminal being coupled to the second input terminal.

2. The apparatus of claim 1, wherein the first, second, third, fourth, fifth and sixth variable loads each comprise a resistor and a field-effect transistor, each resistor having first and second terminals, the first resistor terminal being coupled to a drain terminal of the field-effect transistor and the second resistor terminal being coupled to a source terminal of the field-effect transistor, the field-effect transistor, the field-effect transistor having a gate terminal coupled to a voltage source.

3. The apparatus of claim 2, further comprising a resistive load coupled between the voltage source and the gate terminal.

4. The apparatus of claim 2 wherein the voltage source is variable.

5. A circuit for use with a radio-frequency amplifier, comprising:
    a first stage comprising a first nonlinear element coupled in electrical series with a first variable load, a second nonlinear element coupled in electrical series with a second variable load, and a third variable load coupled in electrical parallel with the first and second nonlinear elements and the first and second variable loads;
    a second stage comprising a third nonlinear element coupled in electrical series with a fourth variable load, a fourth nonlinear element coupled in electrical series with a fifth variable load, a sixth variable load coupled in electrical parallel with the third and fourth nonlinear elements and fourth and fifth variable loads, and a low-pass filter coupled in electrical parallel with the sixth variable load,
    the first stage adapted to receive a signal from a single source, modify the magnitude and phase of the signal, and provide a first modified signal to the second stage, the second stage adapted to receive the first modified signal from the first stage, further modify the magnitude and phase of the first modified signal, and provide a second modified signal to the radio-frequency amplifier.

6. The circuit of claim 5, wherein the first, second, third, and fourth linear elements are diodes.

7. The circuit of claim 5, wherein the first and second variable loads comprise a single variable load.

8. The circuit of claim 7, wherein the fourth and fifth variable loads comprise a single variable load.

9. A method of modifying a signal for later amplification, comprising:
    adjusting variable loads in a circuit to provide a desired magnitude characteristic, wherein the variable loads are adjusted by changing a voltage level applied to a gate terminal of a field-effect transistor to alter its conductivity;
    adjusting variable loads in the circuit to provide a desired phase characteristic, wherein the variable loads are adjusted by changing a voltage level applied to a gate terminal of a field-effect transistor to alter its conductivity;
    receiving the signal to be modified;
    modifying the signal using the desired magnitude and phase characteristics to produce a distorted signal;
    providing the distorted signal to an amplifier for amplification,
    wherein the modification of the signal is at least partially offset by a modification of the modified signal by the amplifier, resulting in an amplifier output signal that has a generally linear region.

10. A method of molding modifying a signal for later amplification comprising:
    adjusting variable loads in a circuit to provide a desired nagnitude characteristic, wherein the variable loads are adjusted by changing a voltage level applied gate terminal of a field-effect transistor to alter its conductivity;
    adjusting variable loads in the circuit to provide a desired phase characteristic, wherein the variable loads are adjusted by changing a voltage level applied to a gate terminal of a field-effect transistor to alter its conductivity;

receiving the signal to be modified;

modifying the signal using the desired magnitude and phase characteristics to produce a distorted signal;

providing the distorted signal to an amplifier for amplification, wherein the modification of the signal is at least partially offset by a modification of the modified signal by the amplifier, resulting in an amplifier output signal that has a generally linear region wherein while receiving the signal to be modified, further adjusting the circuit to refine the magnitude and phase characteristics to optimize the generally linear region.

* * * * *